(12) United States Patent
Chang et al.

(10) Patent No.: US 10,372,242 B2
(45) Date of Patent: Aug. 6, 2019

(54) SCROLL WHEEL MODULE WITH TOUCH SENSING MECHANISM

(71) Applicant: Primax Electronics Ltd., Taipei (TW)

(72) Inventors: Chia-Yuan Chang, Taipei (TW); Chun-Lin Chu, Taipei (TW); Li-Kuei Cheng, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 58 days.

(21) Appl. No.: 15/879,800

(22) Filed: Jan. 25, 2018

(65) Prior Publication Data

US 2019/0129521 A1 May 2, 2019

(30) Foreign Application Priority Data

Oct. 27, 2017 (TW) .............................. 106137175 A

(51) Int. Cl.
G06F 3/03 (2006.01)
G06F 3/0362 (2013.01)
G06F 3/0354 (2013.01)

(52) U.S. Cl.
CPC .......... *G06F 3/0362* (2013.01); *G06F 3/0312* (2013.01); *G06F 3/03547* (2013.01)

(58) Field of Classification Search
CPC .. G06F 3/0362; G06F 3/0312; G06F 3/03547; H03K 17/965; H03K 17/962
See application file for complete search history.

(56) References Cited

U.S. PATENT DOCUMENTS

| 2003/0156098 A1* | 8/2003 | Shaw .................... G06F 3/0312 345/163 |
| 2013/0126325 A1* | 5/2013 | Curtis ................ H03K 17/9622 200/5 A |
| 2018/0260043 A1* | 9/2018 | Forde .................. G06F 3/03543 |

* cited by examiner

*Primary Examiner* — Robert J Michaud
(74) *Attorney, Agent, or Firm* — Kirton McConkie; Evan R. Witt

(57) ABSTRACT

The present invention provides a scroll wheel module with a touch sensing mechanism, where the scroll wheel module includes a scroll wheel body, a touch sensing element, and an encoding element; the scroll wheel body is pivotally connected to a housing, and the middle of the scroll wheel body is provided with a cavity; the touch sensing element is installed in the cavity; the touch sensing element includes a connecting portion and a fixing portion; the connecting portion is pivotally connected to the scroll wheel body; the fixing portion is connected to the housing; and the encoding element is connected to the scroll wheel body. In this way, an effect of arbitrarily switching different function modes to be adjusted is achieved.

15 Claims, 3 Drawing Sheets

SCROLL WHEEL MODULE WITH TOUCH SENSING MECHANISM

FIELD OF THE INVENTION

The present invention relates to a scroll wheel module with a touch sensing mechanism.

BACKGROUND OF THE INVENTION

Scroll wheel modules, as function adjustment buttons, are widely applied to electronic products. For example, a scroll wheel module may be used as a volume adjustment button or a screen brightness adjustment button, and the volume or the screen brightness of an electronic product may be adjusted merely by rolling a scroll wheel body of the scroll wheel module.

However, current electronic products are generally electronic products with a plurality of functions. Therefore, the electronic products are commonly provided with a plurality of function adjustment buttons. For ease of carrying, the electronic products gradually trends to be light, thin, and small, resulting in a small space for arranging the function adjustment buttons.

Therefore, a plurality of scroll wheel modules used as function adjustment buttons may generally be arranged together or in a row in a same space. One scroll wheel module corresponds to one encoder for function adjustment, so that when the plurality of scroll wheel modules with adjustment functions are designed or installed in a same space or area, problems such as a complex structure and difficult assembly are generated, which need to be resolved urgently.

SUMMARY OF THE INVENTION

A main objective of the present invention is to provide a mouse with an electromagnet module.

In a preferred embodiment, the present invention provides a scroll wheel module with a touch sensing mechanism, installed in a housing, where the scroll wheel module includes a scroll wheel body, a touch sensing element, and an encoding element. The scroll wheel body is pivotally connected to the housing, and the middle of the scroll wheel body is provided with a cavity. The touch sensing element is installed in the cavity. One end of the touch sensing element includes a connecting portion and the other end of the touch sensing element includes a fixing portion. The connecting portion is pivotally connected to the scroll wheel body. The fixing portion extends out of the scroll wheel body and is connected to the housing. The encoding element is connected to the scroll wheel body. The encoding element is located on a side of the scroll wheel body away from the fixing portion. The encoding element rotates along with the scroll wheel body, where the touch sensing element can generate a position recognition signal according to a touched position on the scroll wheel body. In this way, an effect of arbitrarily switching different function modes to be adjusted is achieved.

Preferably, an outer surface of the scroll wheel body is provided with a first touch area, a second touch area, and a third touch area. The first touch area is adjacent to the fixing portion. The first touch area is adjacent to the connecting portion. The second touch area is located between the first touch area and the third touch area. Preferably, a middle part of the touch sensing element includes a sensing portion. The sensing portion is arranged corresponding to the first touch area, the second touch area, and the third touch area. Preferably, the sensing portion is located between the connecting portion and the fixing portion. Preferably, the first touch area, the second touch area, and the third touch area are touched so that the position recognition signal of the touch sensing element can be generated by using the sensing portion. In this way, effects of simplifying a structure, saving material costs, simplifying an assembly procedure, and saving assembly costs are achieved.

Preferably, the scroll wheel module further includes a bearing, where the bearing is installed in the cavity. One side of the bearing is pivotally connected to the scroll wheel body and is located on a side of the cavity adjacent to the encoding element. The connecting portion is fixed on a side of the bearing away from the encoding element. The touch sensing element is pivotally connected to the scroll wheel body by using the bearing. Preferably, the side of the bearing away from the encoding element is provided with a slot. The connecting portion is plugged into the slot to be connected to the bearing. In this way, an effect of facilitating to replace or maintain the touch sensing element is achieved.

Preferably, the touch sensing element is located in the cavity and divides the cavity into a first chamber and a second chamber. Preferably, the bearing, the scroll wheel body, the cavity, and the encoding element are on a same central axis. In this way, an effect of prolonging a service life of the scroll wheel module is achieved.

Preferably, the scroll wheel module further includes a supporting frame, where the bottom of the supporting frame is fixed on the housing. The fixing portion is fixed on the supporting frame. The fixing portion is fixed on the housing by using the supporting frame. Preferably, a side of the scroll wheel body adjacent to the supporting frame is provided with a through hole. The through hole is in communication with the cavity. The fixing portion extends out of the through hole to be fixed on the supporting frame. Preferably, the scroll wheel module further includes a fixing member, where the fixing member is sequentially connected to the fixing portion and the supporting frame, so that the fixing portion is fixed on the supporting frame by using the fixing member. Preferably, the fixing member is a screw. In this way, an effect of facilitating to replace or maintain the touch sensing element is achieved.

Preferably, the touch sensing element is a capacitive touch sensor, a capacitive touch sensing circuit board, or a capacitive touch sensing module. Preferably, the encoding element is an encoder.

DETAILED DESCRIPTION OF THE PREFERRED EMBODIMENT

Figure 1:
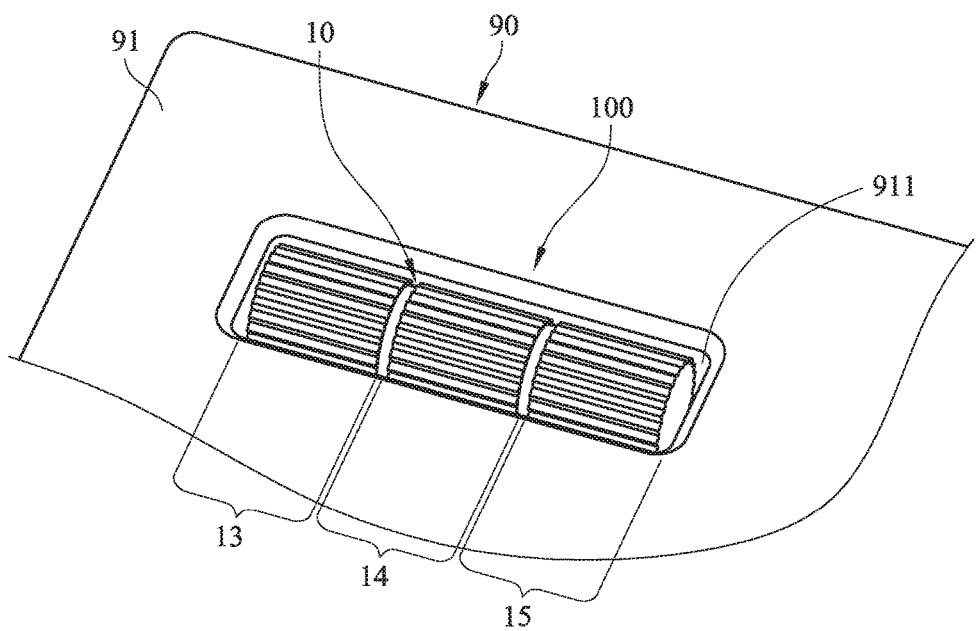
FIG. 1 is a schematic diagram of a scroll wheel with a touch sensing mechanism according to the present invention.
Figure 2:
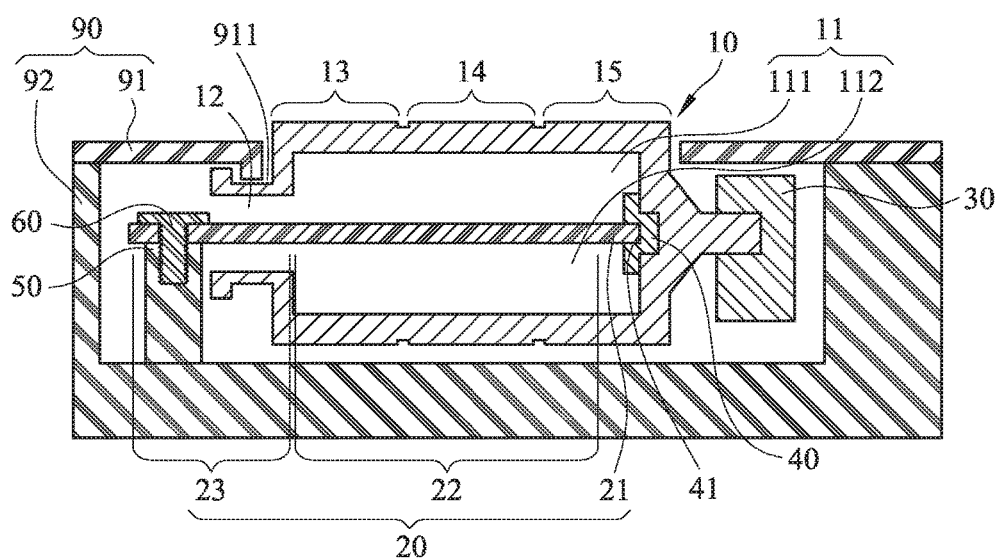
FIG. 2 is a cross-sectional view of a scroll wheel with a touch sensing mechanism according to the present invention.

Referring to FIG. 1 and FIG. 2, FIG. 1 and FIG. 2 are a schematic diagram and a cross-sectional view of a scroll wheel with a touch sensing mechanism according to the present invention. The scroll wheel module 100 with a touch sensing mechanism is installed in a housing 90 of an electronic product. The electronic product may be a mouse, a remote control, sound equipment, or a CD player, and is not limited herein. The scroll wheel module 100 includes a scroll wheel body 10, a touch sensing element 20, an encoding element 30, a bearing 40, a supporting frame 50, and a fixing member 60.

The housing 90 includes an upper cover 91 and a lower cover 92. The upper cover 91 correspondingly covers the lower cover 92. An accommodating space 93 is formed between the upper cover 91 and the lower cover 92. The upper cover 91 is provided with an opening 911. The opening 911 and the accommodating space 93 are in mutual communication.

The scroll wheel module 100 is installed in the accommodating space 93. A part of an external portion of the scroll wheel body 10 can be exposed out of the accommodating space 93 from the opening 911, so that a user can conveniently roll the scroll wheel body 10 with a finger.

The scroll wheel body 10 is pivotally connected to the lower cover 92. The scroll wheel body 10 can be pivotally connected to the lower cover 92 by using a pair of bearing frames. The bottoms of the pair of bearing frames are separately fixed on the lower cover 92 and are located in the accommodating space 93. Further, the pair of bearing frames can be located at two sides of the scroll wheel body 10, so that the two sides of the scroll wheel body 10 are separately pivotally connected to the bearing frames. The scroll wheel body 10 is located between the pair of bearing frames, but the present invention is not limited herein. The scroll wheel body 10 may be pivotally connected to the lower cover 92, the housing 90, or the like in another manner.

A middle part of the scroll wheel body 10 is provided with a cavity 11. One side of the scroll wheel body 10 is provided with a through hole 12, and the through hole 12 is in communication with the cavity 11. An outer surface of the scroll wheel body 10 is provided with a first touch area 13, a second touch area 14, and a third touch area 15. The second touch area 14 is located between the first touch area 13 and the third touch area 15. The first touch area 13 is adjacent to the through hole 12. For the scroll wheel body 10, parts of the first touch area 13, the second touch area 14, and the third touch area 15 are exposed out of the upper cover 91 from the opening 911 of the upper cover 91, so that the user can conveniently touch the first touch area 13, the second touch area 14, or the third touch area 15 and roll the scroll wheel body 10.

The touch sensing element 20 is installed in the cavity 11 of the scroll wheel body 10 and divides the cavity 11 into a first chamber 111 and a second chamber 112. The touch sensing element 20 includes a connecting portion 21, a sensing portion 22, and a fixing portion 23. The connecting portion 21 and the fixing portion 23 are respectively located at two ends of the touch sensing element 20. The sensing portion 22 is located between the connecting portion 21 and the fixing portion 23. The connecting portion 21 is adjacent to the third touch area 15. The fixing portion 23 is adjacent to the first touch area 13. The sensing portion 22 of the touch sensing element 20 is arranged corresponding to the first touch area 13, the second touch area 14, and the third touch area 15. When the user touches or rolls the first touch area 13, the second touch area 14, or the third touch area 15, the sensing portion 22 can generate a position recognition signal by detecting a position that the user touches on the scroll wheel body 10, so that the touch sensing element 20 can generate the position recognition signal by using the sensing portion 22. The fixing portion 23 extends out of the cavity 11 of the scroll wheel body 10 toward the through hole 12. The touch sensing element 20 is a capacitive touch sensor, a capacitive touch sensing circuit board, or a capacitive touch sensing module.

The encoding element 30 is located on a side of the scroll wheel body 10 away from the fixing portion 23. The encoding element 30 is connected to the scroll wheel body 10. The encoding element 30 rotates along with the scroll wheel body 10. The encoding element 30 is an encoder.

The bearing 40 is installed in the cavity 11 of the scroll wheel body 10. The bearing 40 is located on a side of the cavity 11 adjacent to the encoding element 30. One side of the bearing 40 is pivotally connected to the scroll wheel body 10 and another side the bearing 40 is connected to the connecting portion 21 of the touch sensing element 20. The connecting portion 21 is located on a side of the bearing 40 away from the encoding element 30, so that the touch sensing element 20 is pivotally connected to the scroll wheel body 10 by using the bearing 40. The bearing 40, the scroll wheel body 10, the cavity 11, and the encoding element 30 are on a same central axis. Further, the side of the bearing 40 away from the encoding element 30 is provided with a slot 41. The connecting portion 21 is plugged into the slot 41 to be connected to the bearing 40.

The bottom of the supporting frame 50 is fixed on the lower cover 92. The fixing portion 23 of the touch sensing element 20 extends out of the cavity 11 of the scroll wheel body 10 from the through hole 12 to connect to the supporting frame 50. The fixing member 60 is sequentially connected to the fixing portion 23 and the supporting frame 50, so that the fixing portion 23 is fixed on the supporting frame 50 by using the fixing member 60. The fixing member 60 is a screw, but is not limited herein.

During use, when the finger of the user touches the first touch area 13, the second touch area 14, or the third touch area 15 the scroll wheel body 10, the sensing portion 22 of the touch sensing element 20 may detect the position that the user touches on the scroll wheel body 10, so that the sensing portion 22 generates the position recognition signal. When the sensing portion 22 detects that the user touches the first touch area 13, the position recognition signal generated by the sensing portion 22 includes position information of the first touch area 13. When the user touches the second touch area 14, the position recognition signal generated by the sensing portion 22 includes position information of the second touch area 14. Furthermore, when the user touches the third touch area 15, the position recognition signal generated by the sensing portion 22 includes position information of the third touch area 15.

When the sensing portion 22 generates the position recognition signal, the sensing portion 22 transmits the position recognition signal to the electronic product. The electronic product presets a first function mode, a second function mode, and a third function mode respectively corresponding to the first touch area 13, the second touch area 14, and the third touch area 15. The first touch area 13 corresponds to the first function mode. The second touch area 14 corresponds to the second function mode. The third touch area 15 corresponds to the third function mode.

Later, when a control module of the electronic product receives the position recognition signal generated by the touch sensing element 20, the electronic product determines a current function mode to be adjusted is the first function mode, the second function mode, or the third function mode according to position information included in the position recognition signal. At last, when the user rolls the scroll wheel body 10 to drive the encoding element 30 to rotate, the encoding element 30 may actually adjust a function value according to the function mode to be adjusted.

When content of the position recognition signal includes the position information of the first touch area 13, the electronic product automatically switches a mode to be adjusted of the scroll wheel module 100 to the first function mode. When the content of the position recognition signal includes the position information of the second touch area 14, the electronic product automatically switches the mode to be adjusted of the scroll wheel module 100 to the second function mode. When the content of the position recognition signal includes the position information of the third touch area 15, the electronic product automatically switches the mode to be adjusted of the scroll wheel module 100 to the third function mode. In this way, the function mode to be adjusted may be switched according to the position that the user touches on the scroll wheel body 10.

Figure 3:
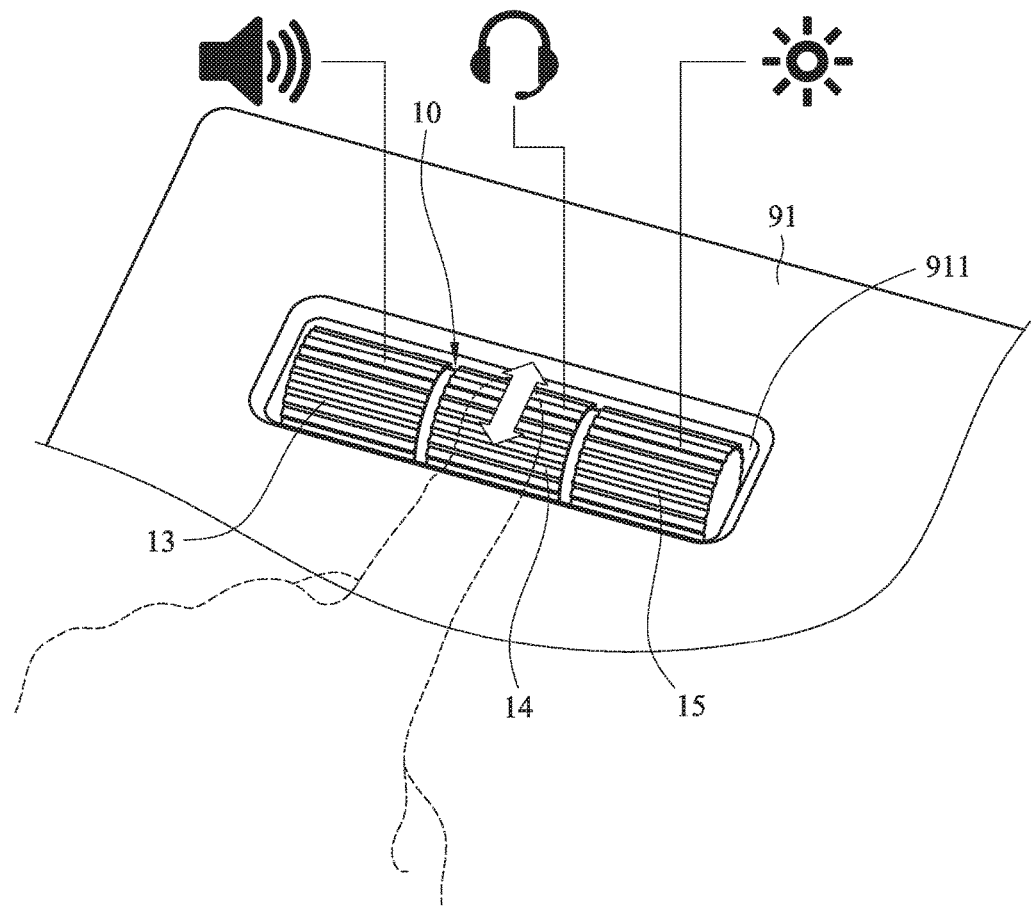
FIG. 3 is a diagram of a use state of a scroll wheel with a touch sensing mechanism according to the present invention.

In addition, referring to FIG. 3, FIG. 3 is a diagram of a use state of a scroll wheel module with a touch sensing mechanism according to the present invention. The first function mode is a volume adjustment function button, but is not limited herein. The second function mode is a microphone volume adjustment function button in an earphone mode, but is not limited herein. The third function mode is a screen brightness adjustment function button, but is not limited herein. Therefore, when the user touches the first touch area 13 and rolls the scroll wheel body 10, the scroll wheel module 100 may be switched to the volume adjustment function button to adjust the volume of a built-in or an external speaker of the electronic product. When the user touches the second touch area 14 and rolls the scroll wheel body 10, the scroll wheel module 100 may be switched to the microphone volume adjustment function button in an earphone mode to adjust the volume of an external earphone microphone of the electronic product. When the user touches the third touch area 15 and rolls the scroll wheel body 10, the scroll wheel module 100 may be switched to the screen brightness adjustment function button to adjust the screen brightness of a built-in or an external screen of the electronic product.

In addition, because the bearing 40, the scroll wheel body 10, the cavity 11, and the encoding element 30 are on a same central axis, when the user rolls the scroll wheel body 10, eccentricity can be avoided. In this way, an effect of prolonging a service life of the scroll wheel module 100 is achieved.

Moreover, because the touch sensing element 20 is only installed in the cavity 11 of the scroll wheel body 10, an effect of arbitrarily switching the function mode to be adjusted is achieved. In this way, effects of simplifying a structure, saving material costs, simplifying an assembly procedure, and saving assembly costs are achieved.

In addition, the touch sensing element 20 is fixed on the supporting frame 50 by using the fixing member 60, and the touch sensing element 20 is pivotally connected to the scroll wheel body 10 by using the bearing 40. When the touch sensing element 20 is faulty, the faulty touch sensing element 20 may be detached from the scroll wheel module 100 merely by loosening the fixing member 60 to detach the fixing portion 23 of the touch sensing element 20 from the supporting frame 50 and pulling out the connecting portion 21 from the slot 41 of the bearing 40. Next, a new touch sensing element 20 is replaced with and installed in the scroll wheel module 100. In this way, an effect of easily replacing or maintaining the touch sensing element 20 is achieved.

It can be learned from the foregoing descriptions that: first, the touch sensing element 20 is installed in the scroll wheel body 10, so that an effect of arbitrarily switching different function modes to be adjusted and effects of simplifying a structure, saving material costs, simplifying an assembly procedure, and saving assembly costs are further achieved; second, the bearing 40, the scroll wheel body 10, the cavity 11, and the encoding element 30 are on a same central axis, so that an effect of prolonging a service life of the scroll wheel module 100 is achieved; third, by means of the arrangement of the bearing 40 and the fixing member 60, an effect of facilitating to replace or maintain the touch sensing element 20 is achieved.

The foregoing descriptions are merely preferred embodiments of the present invention, and are not intended to limit the patent scope of the present invention. Therefore, any equivalent change or modification completed without departing from the spirit disclosed in the present invention shall fall within the patent scope of this application.

What is claimed is:

1. A scroll wheel module with a touch sensing mechanism, installed in a housing, wherein the scroll wheel module comprises:
   a scroll wheel body, pivotally connected to the housing, wherein the middle of the scroll wheel body is provided with a cavity;
   a touch sensing element, installed in the cavity, wherein one end of the touch sensing element comprises a connecting portion and another end of the touch sensing element comprises a fixing portion; the connecting portion is pivotally connected to the scroll wheel body; and the fixing portion extends out of the scroll wheel body and is connected to the housing; and
   an encoding element, connected to the scroll wheel body, wherein the encoding element is located on a side of the scroll wheel body away from the fixing portion; and the encoding element rotates along with the scroll wheel body, wherein
   the touch sensing element can generate a position recognition signal according to a touched position on the scroll wheel body.

2. The scroll wheel module with a touch sensing mechanism according to claim 1, wherein an outer surface of the scroll wheel body is provided with a first touch area, a second touch area, and a third touch area; the first touch area is adjacent to the fixing portion; the first touch area is adjacent to the connecting portion; and the second touch area is located between the first touch area and the third touch area.

3. The scroll wheel module with a touch sensing mechanism according to claim 2, wherein a middle part of the touch sensing element comprises a sensing portion; and the sensing portion is arranged corresponding to the first touch area, the second touch area, and the third touch area.

4. The scroll wheel module with a touch sensing mechanism according to claim 3, wherein the sensing portion is located between the connecting portion and the fixing portion.

5. The scroll wheel module with a touch sensing mechanism according to claim 3, wherein the first touch area, the second touch area, and the third touch area are touched so that the position recognition signal of the touch sensing element can be generated by using the sensing portion.

6. The scroll wheel module with a touch sensing mechanism according to claim 5, further comprising a bearing, wherein the bearing is installed in the cavity; one side of the bearing is pivotally connected to the scroll wheel body and is located on a side of the cavity adjacent to the encoding element; the connecting portion is fixed on a side of the bearing away from the encoding element; and the touch sensing element is pivotally connected to the scroll wheel body by using the bearing.

7. The scroll wheel module with a touch sensing mechanism according to claim 6, wherein the side of the bearing away from the encoding element is provided with a slot; and the connecting portion is plugged into the slot to be connected to the bearing.

8. The scroll wheel module with a touch sensing mechanism according to claim 6, wherein the touch sensing element is located in the cavity and divides the cavity into a first chamber and a second chamber.

9. The scroll wheel module with a touch sensing mechanism according to claim 6, wherein the bearing, the scroll wheel body, the cavity, and the encoding element are on a same central axis.

10. The scroll wheel module with a touch sensing mechanism according to claim 6, further comprising a supporting frame, wherein the bottom of the supporting frame is fixed on the housing; the fixing portion is fixed on the supporting frame; and the fixing portion is fixed on the housing by using the supporting frame.

11. The scroll wheel module with a touch sensing mechanism according to claim 10, wherein a side of the scroll wheel body adjacent to the supporting frame is provided with a through hole; the through hole is in communication with the cavity; and the fixing portion extends out of the through hole to be fixed on the supporting frame.

12. The scroll wheel module with a touch sensing mechanism according to claim 11, further comprising a fixing member, wherein the fixing member is sequentially connected to the fixing portion and the supporting frame, so that the fixing portion is fixed on the supporting frame by using the fixing member.

13. The scroll wheel module with a touch sensing mechanism according to claim 12, wherein the fixing member is a screw.

14. The scroll wheel module with a touch sensing mechanism according to claim 1, wherein the touch sensing element is a capacitive touch sensor, a capacitive touch sensing circuit board, or a capacitive touch sensing module.

15. The scroll wheel module with a touch sensing mechanism according to claim 1, wherein the encoding element is an encoder.

* * * * *